United States Patent [19]

Sadigh-Behzadi

[11] Patent Number: 4,468,072

[45] Date of Patent: Aug. 28, 1984

[54] MULTI-PIN ZERO INSERTION FORCE CONNECTOR

[75] Inventor: Amir-Akbar Sadigh-Behzadi, Van Nuys, Calif.

[73] Assignee: Thomas & Betts Corporation, Raritan, N.J.

[21] Appl. No.: 331,665

[22] Filed: Dec. 17, 1981

[51] Int. Cl.³ .............................................. H01R 13/62
[52] U.S. Cl. ................................. 339/74 R; 339/75 M
[58] Field of Search ................ 339/74 R, 75 R, 75 M, 339/75 MP

[56] References Cited

U.S. PATENT DOCUMENTS

| | | | |
|---|---|---|---|
| 3,094,365 | 6/1963 | Chamberlain et al. | 339/75 |
| 3,489,986 | 1/1970 | Frederick | 339/75 M |
| 3,569,905 | 3/1971 | Kehagioglou | 339/75 |
| 3,670,288 | 6/1972 | Evans | 339/74 R |
| 3,763,459 | 10/1973 | Millis | 339/75 M |
| 3,865,457 | 2/1975 | Carter | 339/74 R |
| 4,050,759 | 9/1977 | Jackson et al. | 339/75 M |
| 4,054,347 | 10/1977 | Mouissie | 339/75 |
| 4,077,688 | 3/1978 | Cobaugh et al. | 339/74 R |
| 4,082,399 | 4/1978 | Barkhuff | 339/75 M |
| 4,196,955 | 4/1980 | Anhalt | 339/74 R |
| 4,381,130 | 4/1983 | Sprenkle | 339/74 R |

OTHER PUBLICATIONS

IBM Bulletin, Vol. 13, No. 5, Oct. 1970, "Insertion/Extraction Test Socket", by S. I. Bruder.
IBM Bulletin, Vol. 18, No. 10, Mar. 1976, "Enhanced Zero Insertion Connector", by R. G. Meeker.

*Primary Examiner*—Eugene F. Desmond
*Assistant Examiner*—Gary F. Paumen
*Attorney, Agent, or Firm*—Robert M. Rodrick; Salvatore J. Abbruzzese

[57] ABSTRACT

A connector of zero insertion force type includes a cam movable responsively to operator input to open contact elements for insertion therein of terminal pins of an electronic package, the contact elements being so configured and supported as to impart reverse movement to the cam upon discontinuance of the operator input and to resiliently engage the terminal pins.

14 Claims, 9 Drawing Figures

4,468,072

MULTI-PIN ZERO INSERTION FORCE CONNECTOR

FIELD OF THE INVENTION

This invention relates generally to electrical connectors and pertains more particularly to connectors of so-called zero or low insertion force type.

BACKGROUND OF THE INVENTION

A common expedient in zero force connection of the terminal pins of electronic packages and contacts of connectors is the use of a cam member mounted for translation in the connector to displace the connector contacts into electrical engagement with terminal pins of the package after previous force-free insertion of the pins into the connector. In the varieties of such connectors known heretofore, the cam member typically has associated therewith an actuator extending from the connector to be accessible to an operator. When the actuator disposes the cam member in an inactive position, the connector contacts are in non-interfering attitude with respect to pin insertion paths. Typically, the contacts of such connectors are normally open, i.e., being self-biased to such open state as in U.S. Pat. No. 3,569,905, or otherwise relaxed in such state, as in U.S. Pat. No. 4,077,688. Displacement of the contacts from such self-biased or relaxed open condition to engagement with the terminal pins occurs upon actuator movement of the cam member to its active position.

In a recent development set forth in copending patent application Ser. No. 302,445, now U.S. Pat. No. 4,422,703 issued Dec. 27, 1983, entitled "Electrical Connector for use with Multi-Pin Arrays", filed on Sept. 15, 1981 and commonly-assigned herewith, zero or low insertion force connection is attained in a preferred embodiment through the use of elongate contacts which are self-biased into closed state, actuator movement of a cam member being longitudinally of the contacts between an active position, opposing such closing bias of the contact elements and displacing the same to facilitate low insertion force entry of pins therein, and an inactive position wherein the cam member discontinues such bias-opposing function and permits self-biased tight engagement of the contact elements with the pins, giving rise to advantageous electrical performance.

A further aspect of prior art zero or low insertion force connection is seen, for example, in U.S. Pat. No. 3,763,459, wherein plural cam members are translatable by an actuator in opposite directions into respective rearside engagements with facing contact elements to force the same into engagement with a pin freely resident therebetween, this assembly including, as a further component, a spring for advantageously maintaining the cam members in inactive state in the absence of actuator input.

SUMMARY OF THE INVENTION

The present invention has as its primary object the provision of improved connectors of zero or low insertion force type.

A more specific object of the invention is to provide zero or low insertion force connectors having the electrical performance advantage inherent in the self-biased contact-pin engagement noted in the connectors of the referenced copending application and other benefits of previous connectors, but enjoying mechanical structure and performance benefit thereover.

In attaining the foregoing and other objects, the invention provides an electrical connector having a base and a plurality of contacts supported by the base, each contact adapted for receiving a terminal pin and having facing elements biased into preselected attitude for electrically engaging the pin. Cam means is supported in the connector for movement, preferably responsively to operator input, in first sense for engaging the facing elements of the contacts and displacing same from such biased attitude to facilitate low force insertion of the terminal pins therein. In one aspect of the invention, the cam means is displaced in second sense opposite such first sense by the contacts themselves upon release of the operator input, thus obviating need for a separate spring component to enjoy the benefit of displacing the cam means to its inactive position following connection.

In a second aspect of the invention, the cam means itself provides access surface to the operator exteriorly of the connector, thereby obviating need for an actuator or support structure therefor.

In additional aspects, the connector may incorporate plural cam means, preferably in the form of overlying plate members, each providing an abutment to excessive displacement of the other, the combination of plate members providing space saving in that each moves but onehalf of the overall cam means stroke and also providing for halving the force required to be applied at each operator access surface for cam means movement overcoming the contact self-bias. In a still further aspect, the connector provides the benefit of such contact self-biased connection with the terminal pin without requiring inherent bias capacity in the contact when fabricated.

The foregoing and other objects and features of the invention will be further evident from the following detailed discussion of the particularly preferred embodiment thereof and from the drawings wherein like reference numerals identify like parts throughout.

DESCRIPTION OF THE PREFERRED EMBODIMENT

Figure 1:
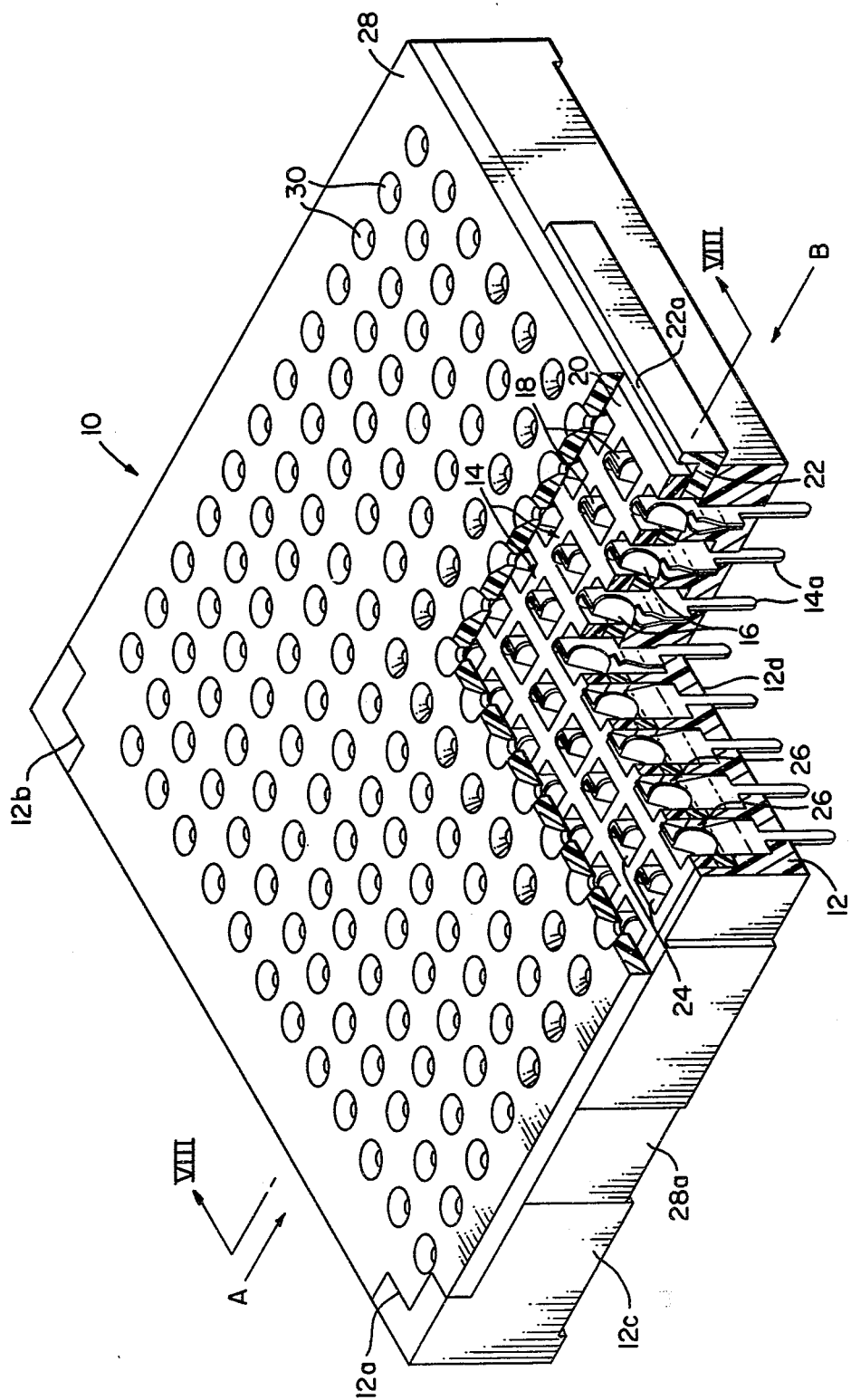
FIG. 1 is a perspective view of a connector in accordance with the invention, the showing being broken away in part and sectioned to show interior detail, particularly for illustrating the arrangement of component parts with the cam means in its inactive position.

Referring to FIG. 1, connector 10 includes base 12 of synthetic electrically insulative material and a plurality of electrical contacts 14. Each contact 14 is a set of individual facing contact elements 16 and 18 biased into mutual mechanical and electrical engagement. Cam plates 20 and 22 are disposed horizontally in upstanding base 12, plate 20 being supported directly by the base and plate 22 being supported on plate 20, both for sliding translatory movement in mutually opposite first and second sense directions, as indicated by arrows A and B.

With cam plates 20 and 22 disposed as in FIG. 1, plate openings 24 and 26 are in vertical registry and contacts 14 extend therethrough with such biased mutual engagement of facing contact elements 16 and 18. Connector 10 further includes cover 28, having openings 30 therethrough in registration with contacts 14. Cover 28 nests in base 12, its residence being polarized by base corners 12a, 12b and complementary cover corner configuration. Cover 28 includes depending legs, leg 28a being shown in FIG. 1 nested in base sidewall 12c, in which position the end of leg 28a will be in releasably latched relation with a base detent, one such detent being shown as 12h in FIG. 7.

In the given configuration a thirteen-by-thirteen connection matrix is provided, i.e., to accomodate a VLSI component (not shown), the terminal pins of which will be seated through cover openings 30 in contacts 14. Stems 14a of the contacts in turn extend outwardly of undersurface 12d of base 12 to be seated in sockets of a printed circuit board (PCB) or like substrate on which the VLSI component is to be mounted.

Figure 3:
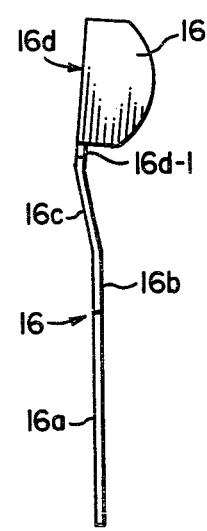
FIG. 3 is side elevation of one contact element of the contact of the FIG. 1 connector.
Figure 4:
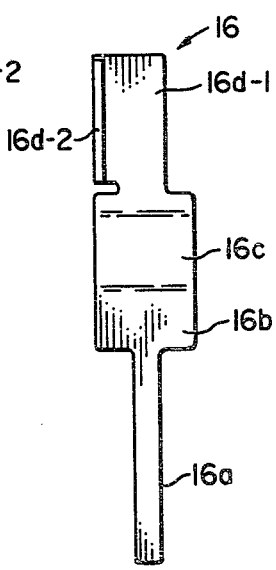
FIG. 4 is a front elevation of the FIG. 3 contact element.

Referring now to FIGS. 3 and 4, contact facing element 16 includes vertically extending lower portion 16a, a vertically extending interior portion 16b of increased width over that of portion 16a, an inclined interior portion 16c, and an oppositely inclined top portion 16d defining contact surface 16d-1 and having flange 16d-2 extending generally orthogonally of surface 16d-1.

Figure 5:
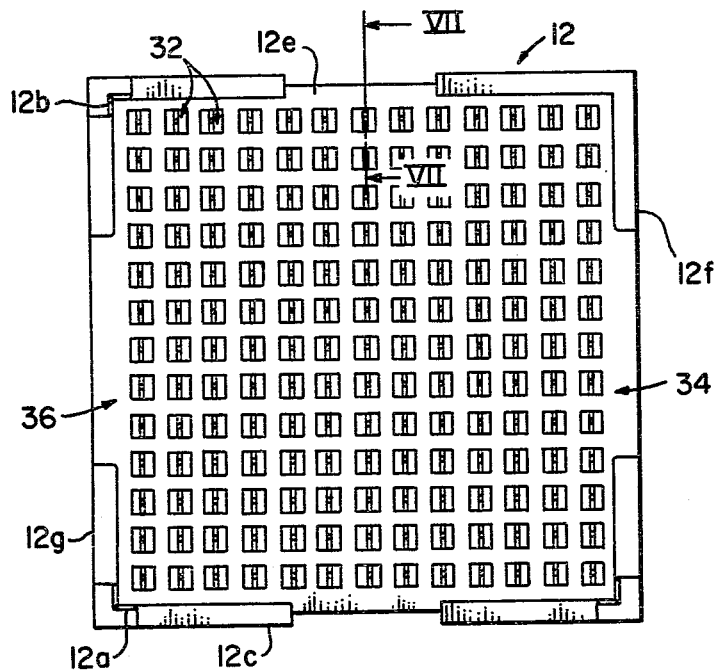
FIG. 5 is a plan elevation of the base of the FIG. 1 connector.
Figure 6:
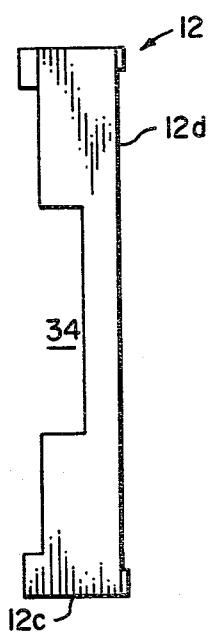
FIG. 6 is a right side elevation of the FIG. 5 base.
Figure 7:
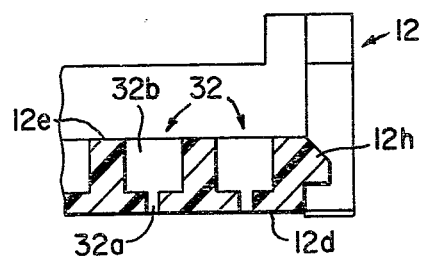
FIG. 7 is a sectional view as would be seen from plane VII—VII of FIG. 5.

The structural detail of base 12 is further shown in FIGS. 5-7 and discussion of connector assembly follows therefrom. Flat interior surface 12e has a matrix of apertures 32 formed therein in correspondence with the VLSI terminal pin matrix. Aperture extent 32a (FIG. 7) opens into base undersurface 12d and is of width corresponding to the width of contact lower portion 16a (FIG. 4). The dimension of extent 32a orthogonal to the plane of FIG. 7 is selected as somewhat less than twice the thickness of contact portion 16a, such that two such portions can be frictionally retained in the aperture. Aperture extent 32b is of width corresponding to the width of contact interior portions 16b and 16c and is of depth below surface 12e approximately equal to the collective vertical course of contact interior portions 16b and 16c.

Figure 2:
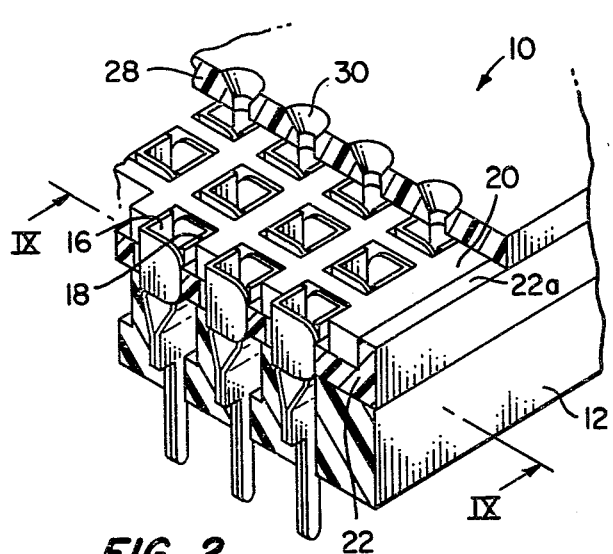
FIG. 2 is a perspective view of a portion of the FIG. 1 connector, sectioned to show the arrangement of component parts with the cam means in its active position.

Contact facing element 18 is identical to contact element 16 in configuration, each contact 14 set being provided by arranging the flanges of the contact elements as opposed sidewalls of the set (FIG. 1), to form, with the contact surfaces, an open box (FIG. 2). With the elements thus arranged, the resulting contact 14 is seated in aperture 32, the flanges and contact surfaces, e.g., flange 16d-2 and surface 16d-1 and counterpart contact element 18 portions, extending upwardly of base surface 12e. As the lower contact element portions, i.e., portion 16a and the counterpart contact element 18 are thus contiguous in vertical aperture extent 32a, the above-mentioned biasing of the contact surfaces into mutual mechanical and electrical engagement is brought about.

Figure 8:
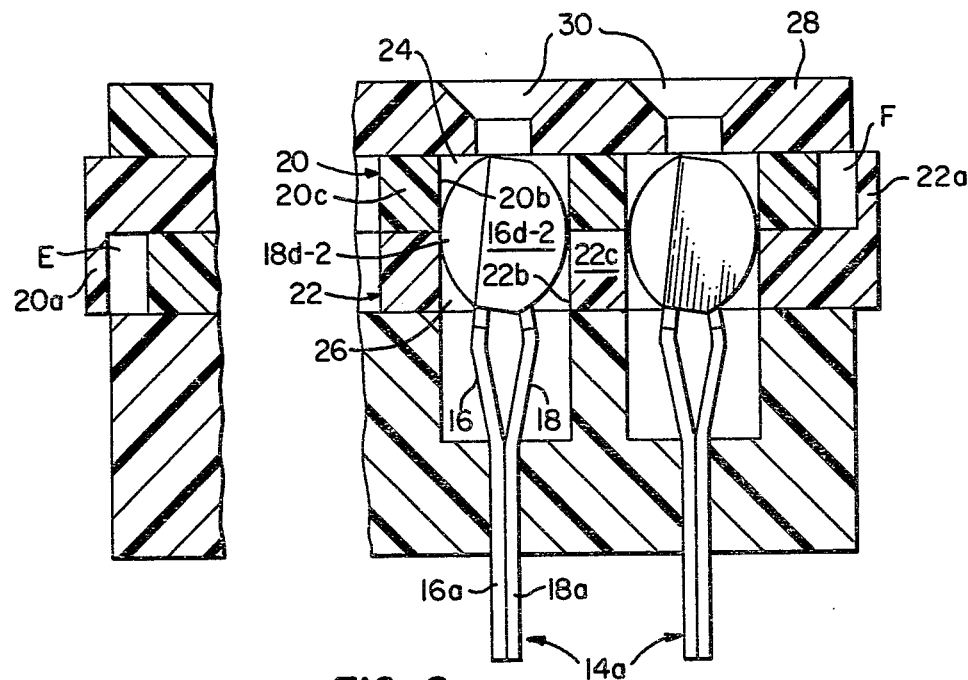
FIG. 8 is sectional view as would be seen from plane VIII—VIII of FIG. 1.

Cam plate 22 is now placed upon base surface 12e with its openings 26 in registry with contacts 14. Stop tab 22a extends in an upward direction as shown in FIG. 1, is resident in recess 34 of base side wall 12f and extends outwardly of the sidewall (FIG. 8). Cam plate 20 is now placed upon cam plate 22 with its openings 24 likewise in registry with contacts 14. Stop tab 20a (FIG. 8) of plate 20 extends in a downward direction, is resident in recess 36 of base sidewall 12g and extends outwardly of the sidewall. Cover 28 is now snapped in place atop cam plate 20.

Figure 9:
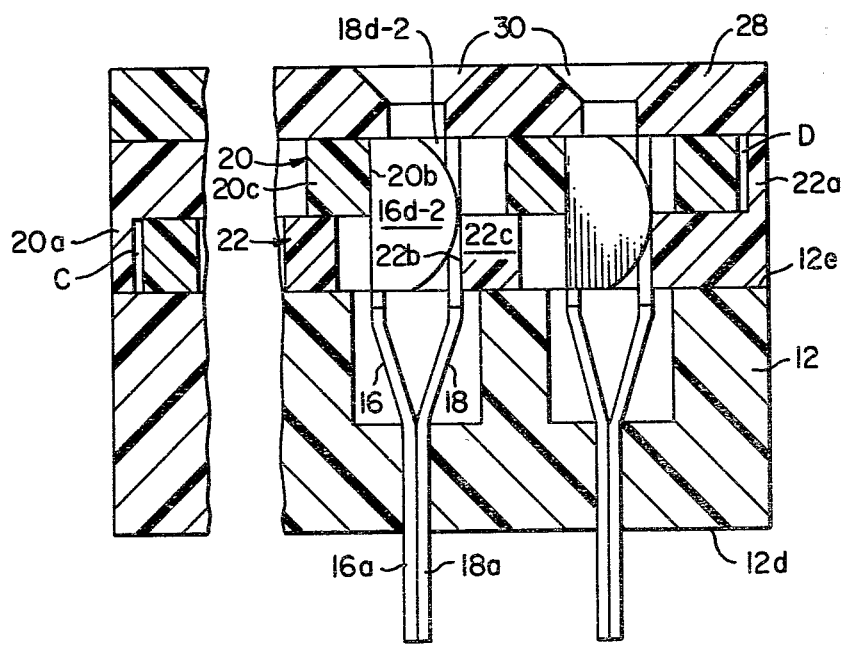
FIG. 9 is a sectional view as would be seen from plane IX—IX of FIG. 2.

Operation of connector 10 will best be understood by considering FIGS. 2 and 9, depicting the connector in its condition (cam means active) for receiving VLSI terminal pins, and then considering FIGS. 1 and 8, depicting the connector in its (cam means inactive) interconnecting state, the VLSI terminal pins being omitted for convenience.

In FIG. 9, stop tabs 20a and 22a of cam plates 20 and 22 have been pressed, as by continuous and opposed thumb-applied or other actuation forces thereon, inwardly of base 12. Plates 20 and 22 are accordingly displaced, respectively rightwardly and leftwardly, to engagingly displace flanges of the contacts. Thus, camming surface 20b bounding opening 24 and provided by cam plate part 20c has, in its rightward travel, engaged flange 18d-2 of contact element 18 and overcome its leftwardly inclined attitude to drive same to true vertical. Likewise, camming surface 22b bounding opening 26 has, in the course of its leftward movement, engaged flange 16d-2 of contact element 16 and overcome its rightwardly inclined attitude to drive same also to true vertical.

Under such continuously applied forces, the connector configuration is such that stop tab 20a is closely spaced with respect to cam plate 22, as at C and stop tab 22a is similarly closely spaced with respect to cam plate 20, as at D in FIG. 9. Further movement of either cam plate will accordingly be abutted by the tab stop of the other cam plate. the resulting contact configuration is that of an open box, as shown in perspective in FIG. 2, contact surfaces 16d-1 and 16d-2 being sufficiently mutually spaced to permit interference-free entry of VLSI terminal pins therein.

Upon residence of the VLSI terminal pins in the connector, omitted for convenience in the drawings, the operator input (e.g., thumb-applied forces) is discontinued, whereupon the connector parts assume dispositions shown in FIGS. 1 and 8. Thus, contact elements 16 and 18 tend to resume their original preselected attitudes, surfaces 16d-1 and 18d-1 electrically engaging such terminal pins (not shown). Flange 16d-2 drives camming surface 22b rightwardly and flange 18d-2 drives camming surface 20b leftwardly. The cam plates are thus displaced outwardly of the connector to dispose tabs 20a and 22a in operator-access positions. The spacing between tabs and plates increases respectively to E and F (FIG. 8).

While the invention has been discussed for use with companion apparatus of VLSI type, terminal pins of which are received in first terminals of the connector contacts and connected through second terminals of the connector contacts to PCB sockets, dual-in-line package (DIP) and other electronic package interconnection to other than PCBs are of course contemplated. Similarly, while the cam means is shown as embodying plural plates each having a plate section with apertures and a tab accessible to the operator, other cam configurations will be apparent. Various changes may thus be introduced in the specifically depicted connector as will be evident to those skilled in the art without departing from the invention. The particularly disclosed preferred embodiment is thus intended in an illustrative and not a limiting sense. The true spirit and scope of the invention is set forth in the following claims.

I claim:

1. An electrical connector for interconnecting a plurality of terminal pins in predetermined array to companion apparatus, comprising:
   (a) a base;
   (b) a plurality of contacts supported by said base in said array, each such contact having a first terminal for connection to said companion apparatus and a second terminal adapted for receiving one such terminal pin and having facing elements biased into preselected attitude for electrically engaging said terminal pin; and
   (c) first and second cam means defining first and second plate members supported in said connector for movement responsive to operator input in respective opposite first and second senses, said first and second plate members including openings therethrough for passage of said facing elements of said contacts, plate member surfaces bounding said openings being engageable with said contacts for displacing same from such biased attitude to facilitate low force insertion of said terminal pins therein upon movement of said first and second cam means, said first and second cam means defining respective first and second surfaces accessible exteriorly of said base for receipt of said operator input, said first and second plate members further including respective first and second plate sections each having a tab extending endwise orthogonally thereof, such tabs extending directionally oppositely of one another in said connector and defining respective abutments for the plate sections in the course of said movements of said first and second cam means, exterior surfaces of said tabs defining said cam means first and second surfaces.

2. The connector claimed in claim 1 wherein said first cam means is supported by said base for translatory movement in said connector and wherein said second cam means is supported by said first cam means for translatory movement in said connector.

3. The connector claimed in claim 1 further including a cover having openings therethrough in registry with said contacts for passage of said terminal pins into residence in said connector.

4. An electrical connector for interconnecting a plurality of terminal pins in predetermined array to companion apparatus, comprising:
   (a) a base;
   (b) a plurality of contacts supported by said base in said array, each such contact having a first terminal for connection to said companion apparatus and a second terminal adapted for receiving one such terminal pin and having facing elements biased into preselected attitude for electrically engaging said terminal pin; and
   (c) cam means supported in said connector for movement responsively to an actuation force in first sense for engaging said facing elements of said contacts and displacing same from such biased attitude to facilitate low force insertion of said terminal pins therein, said cam means being displaced in second sense opposite said first sense by said contacts upon discontinuance of said actuation force.

5. The connector claimed in claim 4 wherein said cam means is supported by said base for translatory movement in said connector.

6. The connector claimed in claim 4 further including a cover having openings therethrough in registry with said contacts for passage of said terminal pins into residence in said connector.

7. The connector claimed in claim 4 wherein said cam means comprises a plate member defining openings therethrough for passage of said contacts, plate member surface bounding said openings being engageable with said contacts in the course of said first sense movement of said cam means.

8. An electrical connector for interconnecting a plurality of terminal pins in predetermined array to companion apparatus, comprising:
   (a) a base;
   (b) a plurality of contacts supported by said base in said array, each such contact having a first terminal for connection to said companion apparatus and a second terminal adapted for receiving one such terminal pin and having facing elements biased into preselected attitude for electrically engaging said terminal pin; and
   (c) first and second cam means supported in said connector for movement responsively to operator input in respective opposite first and second senses for engaging said facing elements of said contacts and displacing same from such biased attitude to facilitate low force insertion of said terminal pins therein, said first cam means being displaced in said second sense and said second cam means being displaced in said first sense by said contacts upon discontinuance of said operator input.

9. The connector claimed in claim 8 wherein said first cam means is supported by said base for translatory movement in said connector and wherein said second cam means is supported by said first cam means for translatory movement in said connector.

10. The connector claimed in claim 8 further including a cover having openings therethrough in registry with said contacts for passage of said terminal pins into residence in said connector.

11. The connector claimed in claim 8 wherein said first and second cam means comprise respective first and second plate members defining openings therethrough for passage of said contacts, plate member surface bounding said openings being engageable with said contacts in the course of said movements of said first and second cam means.

12. The connector claimed in claim 11 wherein said first and second plate members include respective first and second plate sections each having a tab extending endwise orthogonally thereof, such tabs extending oppositely of one another in said connector and defining respective abutments for the plate sections in the course of said movements of said first and second cam means.

13. An electrical connector for interconnecting a plurality of terminal pins in predetermined array to companion apparatus, comprising:
   (a) a base;
   (b) a plurality of contacts supported by said base in said array, each such contact having a first terminal for connection to said companion apparatus and a second terminal adapted for receiving one such terminal pin, each said contact including first and second individual contact elements of identical configuration so disposed in said base as to have respective facing surfaces in resilient mutual engagement; and
   (c) cam means supported in said connector for movement responsively to operator input for engaging said contact elements and displacing same from such resilient mutual engagement to facilitate low force insertion of said terminal pins therein.

14. The connector claimed in claim 13 wherein said cam means comprises first and second cam members supported in said connector for movement in respective opposite first and second senses, said first cam member selectively engaging such first contact elements and said second cam member selectively engaging such second contact elements in the course of such movement thereof.

* * * * *